United States Patent
Abe et al.

(10) Patent No.: US 6,333,945 B1
(45) Date of Patent: Dec. 25, 2001

(54) SEMICONDUCTOR LASER DEVICE

(75) Inventors: Katsunori Abe, Chita-gun; Kinya Atsumi, Okazaki, both of (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/215,259

(22) Filed: Dec. 18, 1998

(30) Foreign Application Priority Data

Dec. 25, 1997 (JP) .................................................. 9-358192
Sep. 10, 1998 (JP) ................................................. 10-256645

(51) Int. Cl.[7] .................................................. H01S 5/20
(52) U.S. Cl. ............................................... 372/46; 372/45
(58) Field of Search ........................................ 372/45, 46

(56) References Cited

U.S. PATENT DOCUMENTS

| | | | |
|---|---|---|---|
| 4,905,246 | 2/1990 | Hayakawa et al. | 372/45 |
| 5,355,384 | 10/1994 | Inoue et al. | 372/46 |
| 5,559,819 | 9/1996 | Abe et al. | 372/46 |
| 5,623,509 | 4/1997 | Iwano et al. | 372/45 |
| 6,118,799 | * 9/2000 | Okubo et al. | 372/45 |

FOREIGN PATENT DOCUMENTS 0177141    4/1986   (EP) .

* cited by examiner

Primary Examiner—James W. Davie
(74) Attorney, Agent, or Firm—Pillsbury Winthrop LLP

(57) ABSTRACT

An active layer in which laser light is generated by injecting driving current therein is sandwiched between semiconductor layers. The active layer has a multi-quantum-well structure, and the layers located at both sides of the active layer are made of an AlGaAs-based material. Refractive indices of the layers are set asymmetrically with respect to the active layer by properly selecting aluminum-mixing ratios in AlGa. Since the light generated in the active layer is distributed more in a layer having a higher refractive index, a peak of the light distribution is shifted from the active layer into the layer having a higher refractive index. Thus, energy concentration to the active layer is avoided. A thickness of the layer having a higher refractive index may be made thicker to further enhance the energy concentration shift from the active layer.

36 Claims, 11 Drawing Sheets

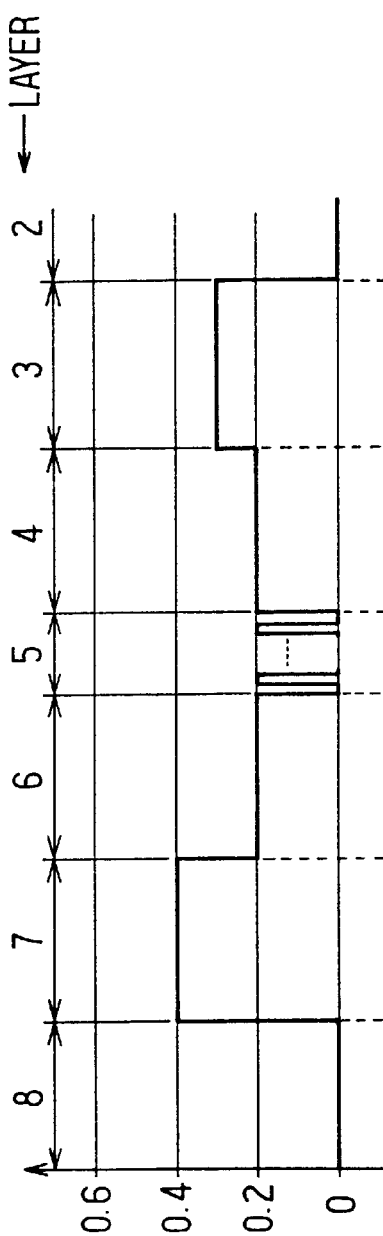
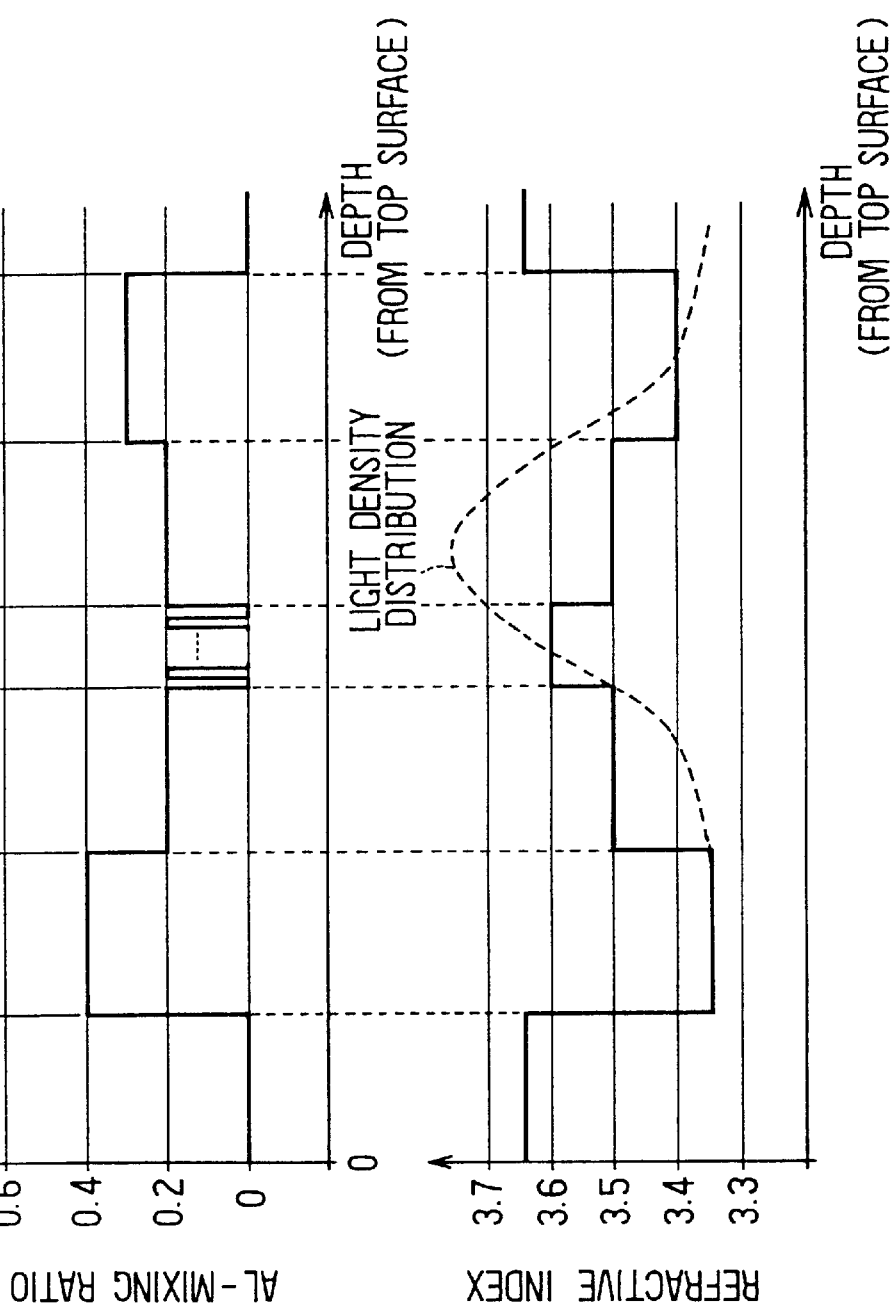
FIG. 6A
FIG. 6B

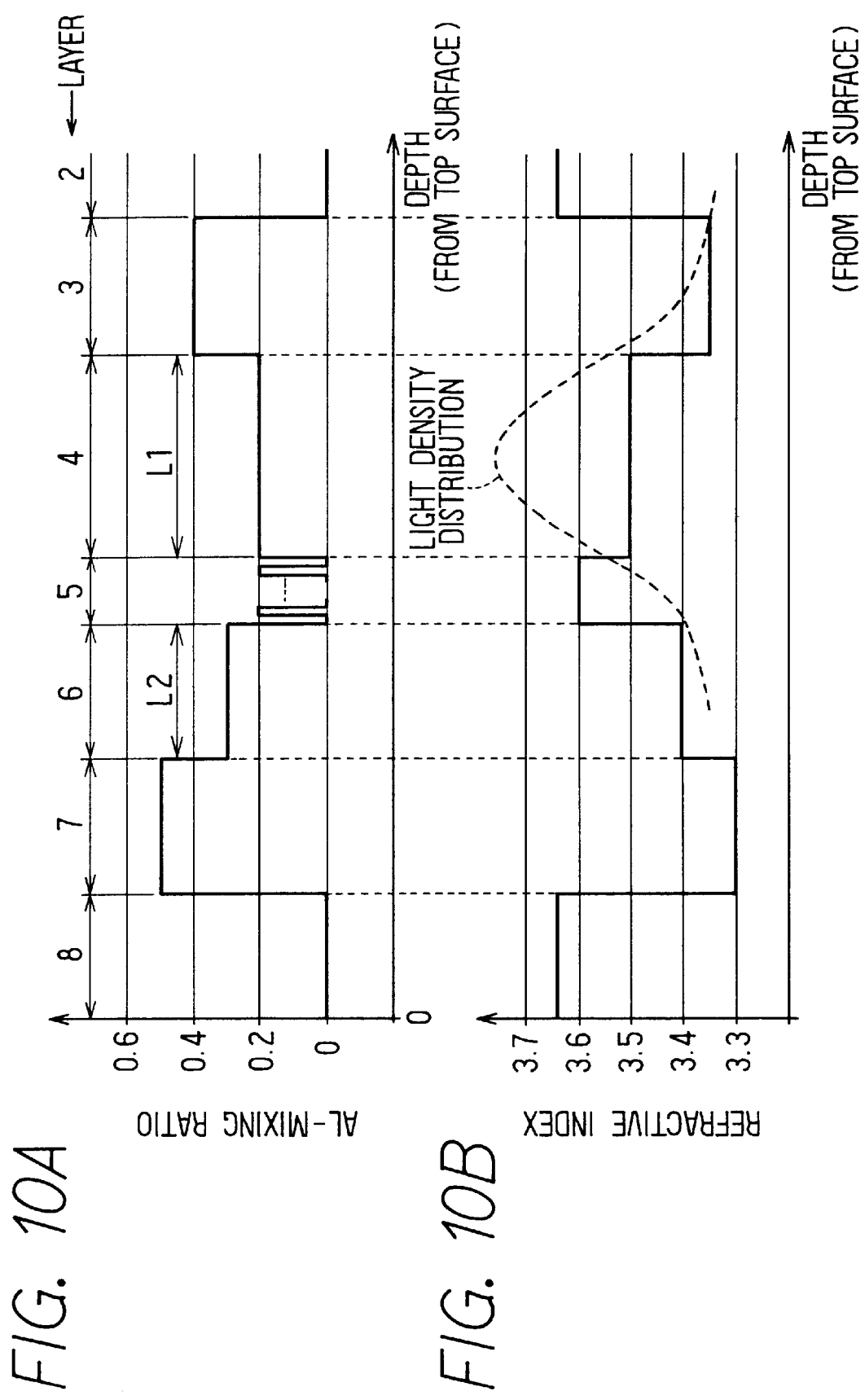

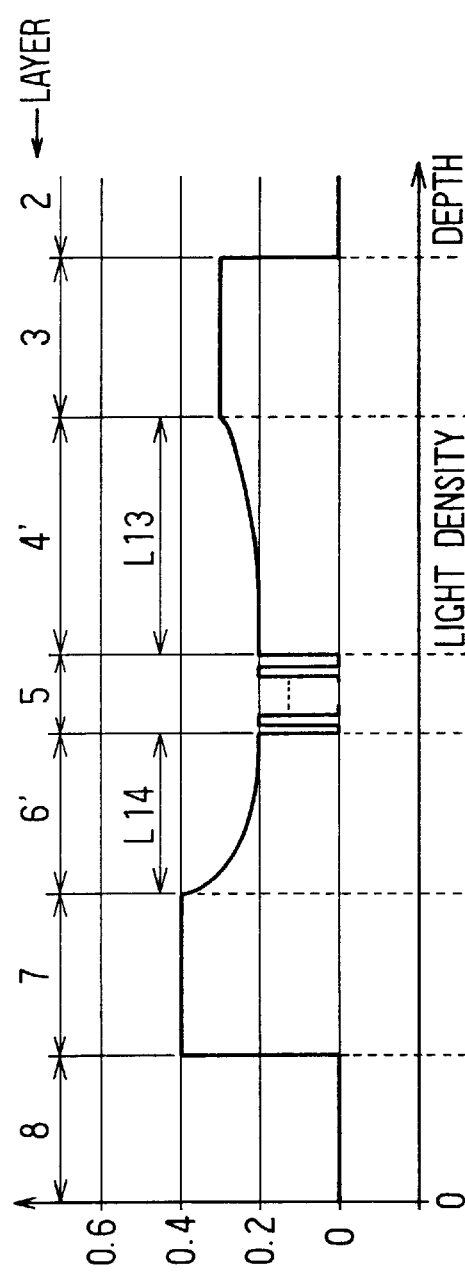
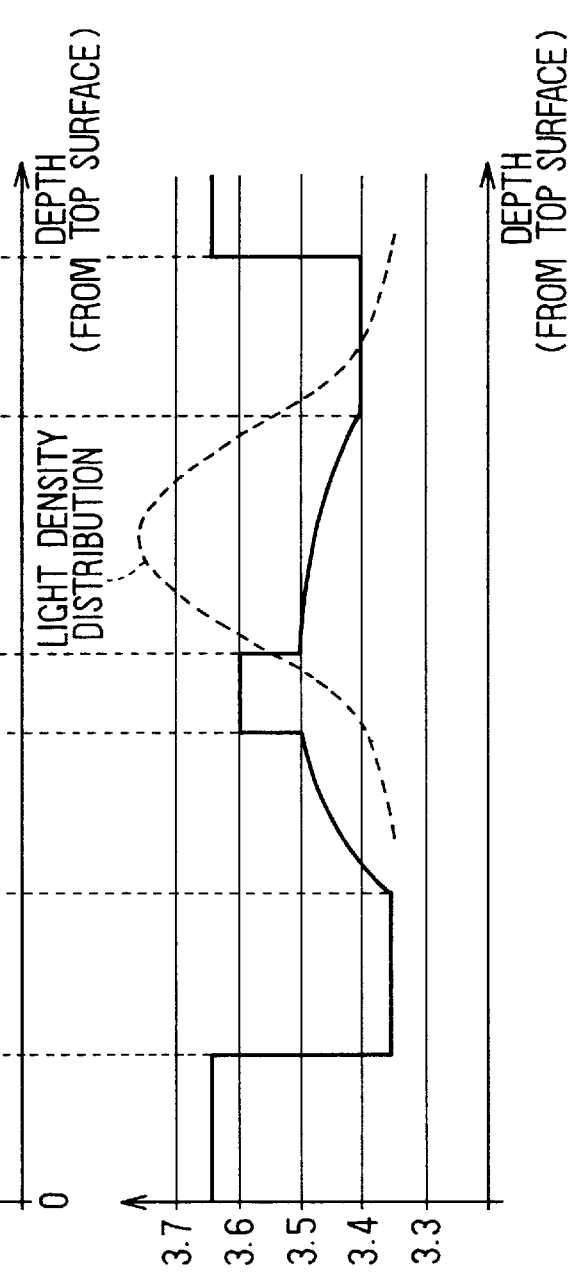
FIG. 11A
FIG. 11B

SEMICONDUCTOR LASER DEVICE

CROSS-REFERENCE TO RELATED APPLICATIONS

This application is based upon and claims benefit of priority of Japanese Patent Applications No. Hei-9-358192 filed on Dec. 25, 1997, and No. Hei-10-256645 filed on Sep. 10, 1998, the contents of which are incorporated herein by reference.

BACKGROUND OF THE INVENTION

1. Field of the Invention

The present invention relates to a semiconductor laser device having a double heterostructure, in which plural semiconductor layers including an active layer are formed on a substrate, and more particularly to such a semiconductor laser device emitting a high power laser beam.

2. Description of Related Art

A semiconductor laser device is used for measuring a distance, for example, in a vision system of a robot and in a radar system. A laser device emits a laser beam toward an object and receives a reflected beam therefrom. A distance between the object and the laser device is measured based on a delay time of the reflected beam which depends on the distance. Since a measurable distance by a laser device depends on its power, a high power laser is necessary to measure a long distance. For example, to measure a distance of 100 m between two cars, a pulse driven laser device having an output of several tens watts is required. To obtain the light output of several tens watts, the laser device has to be driven with pulse current of several tens amperes.

A semiconductor laser device shown in FIGS. 12A and 12B is known as a high power device. This laser device includes an active layer having a multi-quantum-well structure and optical guide layers and clad layers disposed on both sides of the active layer. This structure is proposed to effectively confine light and current. In FIG. 12A, a depth from a top surface is shown on the abscissa and an aluminum-mixing ratio in the layers is shown on the ordinate. On an n-GaAs (n-type gallium arsenide) substrate 102, a first clad layer 103, a first optical guide layer 104, an active layer 105, a second optical guide layer 106, a second clad layer 107 and a p-GaAs (p-type gallium arsenide) layer 108 are laminated in this order. The active layer 105 has a multi-quantum-well structure in which layers made of an AlGaAs-based (aluminum-gallium-arsenide) material and layers made of a GaAs-based material are alternately laminated. Each of such layers in the active layer 105 is made sufficiently thin to a level of an wave-length of de Broglie of an electron and a hole, or less. A total thickness of the active layer 105 is made around 0.1 $\mu$m to effectively confine electric current therein. The clad layers 103, 107 and optical guide layers 104, 106 are made of an AlGaAs-based material in which an Al-mixing ratio (a ratio of Al in AlGa) is properly selected so that each layer performs a desired function.

In FIG. 12B, the depth from the top surface is shown on the abscissa and a refractive index is shown on the ordinate. A band gap of each layer depends on the Al-mixing ratio, and a refractive index thereof depends on the band gap. Therefore, each layer has its refractive index as shown in FIG. 12B. Thus, a SCH structure (separate confinement heterostructure) having a desired refractive index distribution is obtained. Among layers 103, 104, 105, 106 and 107, the active layer 105 has the highest refractive index, the optical guide layers 104, 106 formed on both sides of the active layer 105 have an intermediate refractive index, and the clad layers 103, 107 have the lowest refractive index. Light generated in the active layer 105 is amplified in a region of the active layer 105 and optical guide layers 104, 106 and is distributed as shown by a dotted line in FIG. 12B. Since the light density is distributed, energy concentration to the active layer 105 is alleviated.

A semiconductor laser device having a so-called GRIN-SCH structure (graded index separate confinement heterostructure) is shown in U.S. Pat. No. 4,905,246. In this device, the refractive index of the optical guide layers formed on both sides of the active layer is varied continuously between the active layer and the clad layer. Energy concentration in the active layer is alleviated by distributing light density to both optical guide layers.

Though the light density is distributed in those conventional devices, a peak of the light density is still in the active layer which is made very thin and overlaps with a peak of carriers (current) injected into the active layer. Therefore, the energy concentration in the active layer is not sufficiently reduced. The energy concentration causes dislocation in a crystal of the active layer, which in turn deteriorates the active layer during a long time operation. This results in output power decrease and shortening a life of the device. It is important to avoid such a energy concentration especially in a high power laser device, such as a pulse driven device having an output of several tens watts.

SUMMARY OF THE INVENTION

The present invention has been made in view of the above-mentioned problem, and an object of the present invention is to provide a semiconductor laser device in which a light density distribution peak is shifted from the active layer to avoid overlapping of the light density peak with a current distribution peak in the active layer. In other words, an object of the present invention is to avoid the deterioration of the device caused by energy concentration to the active layer, thereby to enhance its reliability and to prolong its life time.

Plural semiconductor layers including an active layer in which light is generated are laminated on a semiconductor substrate. The active layer has a multi-quantum-well structure in which two layers each having a different energy band gap are alternately laminated. The active layer is sandwiched between upper layers and lower layers. Preferably, the lower layers include a first clad layer and a first optical guide layer, the first optical guide layer being formed in contact with the active layer, and the upper layers include a second clad layer and a second optical guide layer, the second optical guide layer being formed in contact with the active layer. Preferably, the plural layers are made of an AlGaAs-based material. An aluminum-mixing ratio in AlGa of the first optical guide layer is set at a level which is different from that of the second optical guide layer, so that refractive indices thereof are different from each other. Alternatively, the aluminum-mixing ratio of the first clad layer is set at a level which is different from that of the second clad layer for the same purpose.

Since laser light is generated in the active layer by injecting driving current therein, and the generated light is distributed in the layers with a distribution peak in the active layer, energy of the driving current and the generated light concentrates in the active layer if the layers located at both sides of the active layer have symmetrical refractive indices with respect to the active layer. According to the present invention, the refractive indices of layers located at both sides of the active layer are made asymmetrical. The generated light is confined or distributed more in a layer having a higher refractive index than in a layer having a lower refractive index. Accordingly, a peak of the generated light is shifted from the active layer into a neighboring layer having a higher refractive index. Thus, energy concentration to the active layer is avoided, and deterioration of the active layer caused by the energy concentration is greatly alleviated, and thereby a life time of the semiconductor laser device is prolonged.

The energy peak shift is further enhanced by making the layer having a higher refractive index thicker than the layer having a lower refractive index. Avoidance of the energy concentration to the active layer is especially important when the laser device is a high power device which is driven by pulse current having several tens amperes to output several tens watts.

Other objects and features of the present invention will become more readily apparent from a better understanding of the preferred embodiments described below with reference to the following drawings.

BRIEF DESCRIPTION OF THE DRAWINGS

FIG. 6A is a graph showing an aluminum-mixing ratio in each layer of the laser device as a third embodiment;

FIG. 6B is a graph showing a refractive index of each layer and a light density distribution in the third embodiment

FIG. 10A is a graph showing an aluminum-mixing ratio in each layer of the laser device as a sixth embodiment;

FIG. 10B is a graph showing a refractive index of each layer and a light density distribution in the sixth embodiment;

FIG. 11A is a graph showing an aluminum-mixing ratio in each layer of the laser device as a seventh embodiment;

FIG. 11B is a graph showing a refractive index of each layer and a light density distribution in the seventh embodiment;

DETAILED DESCRIPTION OF THE PREFERRED EMBODIMENTS

Figure 1:
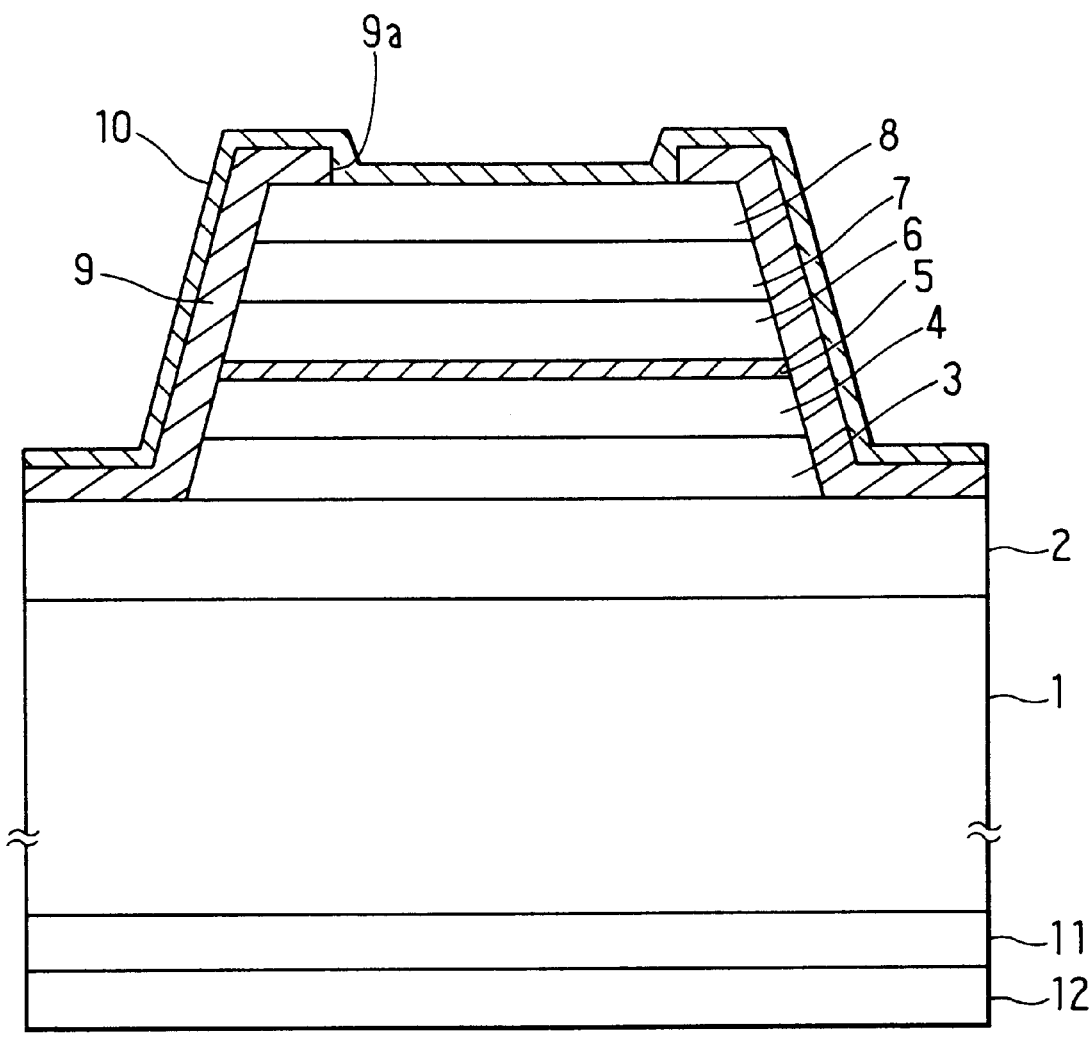
FIG. 1 is a schematic cross-sectional view showing a structure of a semiconductor laser device as a first embodiment.

A semiconductor laser device as a first embodiment of the present invention will be described in reference to FIGS. 1–4. FIG. 1 shows a structure of the first embodiment, in which an active layer having a multi-quantum-well composed of AlGaAs/GaAs-based multi-layers is included. The laser device is designed as a high power laser device.

As shown in FIG. 1, various layers constituting the laser device are laminated on an n-type GaAs substrate 1 in the following order. The respective material and thickness of each layer is as follows:

a layer 2: n-GaAs, 0.5 $\mu$m thick;

a first clad layer 3: n-$Al_{0.4}Ga_{0.6}As$, 1 $\mu$m thick;

a first optical guide layer 4: n-$Al_{0.2}Ga_{0.8}As$, 1 $\mu$m thick;

an active layer 5: GaAs(15 nm)×6/$Al_{0.2}Ga_{0.8}As$(7.5 nm)× 5;

a second optical guide layer 6: p-$Al_{0.3}Ga_{0.7}As$, 1 $\mu$m thick;

a second clad layer 7: p-$Al_{0.5}Ga_{0.5}As$, 1 $\mu$m thick; and a layer 8: p-GaAs, 0.8 $\mu$m thick.

Figure 3:
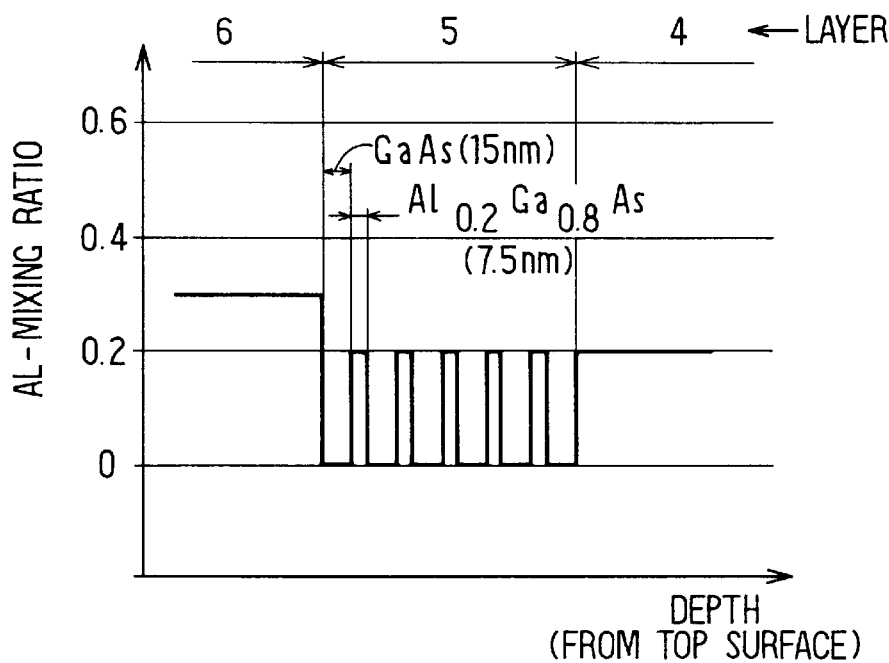
FIG. 3 is a graph showing an aluminum-mixing ratio in an active layer of the laser device.

The detail structure of the active layer 5 is shown in FIG. 3. Six layers of GaAs having a thickness of 15 nm and five layers of $Al_{0.2}Ga_{0.8}As$ having a thickness of 7.5 nm are alternately laminated, making a total thickness of the active layer 5 127.5 nm.

Each of the layers 3–8 is formed in a stripe-shape stretching in a direction perpendicular to the cross-section shown in FIG. 1, and both sides of each layer 3–8 are cut in a mesa-shape. An insulation layer 9 made of an insulation material such as $SiO_2$ is formed to cover the mesa slopes. The insulation layer 9 has an opening 9a on the top surface of the layer 8. The width of the opening 9a is 400 $\mu$m in this particular embodiment (the opening 9a must be wider than 100 $\mu$m for a high power laser of several tens watts). An electrode layer 10 is formed to cover the opening 9a and a whole surface of the insulation layer 9. The electrode layer 10 composed of, for example, three layers, Cr(15 nm thick), Pt(300 nm thick) and Au(600 nm thick), makes an ohmic contact with the layer 8.

On the bottom surface of the substrate 1, another electrode layer 11 and a junction metal layer 12 are formed in this order. The electrode layer 11 is composed of, for example, three laminated layers, AuGe/Ni/Au, and makes an ohmic contact with the substrate 1. The junction metal layer 12 is composed of, for example, laminated two layers such as Au/Sn which are suitable to be bonded to a base plate (not shown) made of copper.

In the laminated structure described above, the aluminum-mixing ratios X1, X2 in the first and second clad layers 3, 7 made of $Al_XGa_{1-X}As$ (0<X<1) and the aluminum mixing ratios Y1, Y2 in the first and second optical guide layers 4, 6 made of $Al_YGa_{1-Y}As$ (0<Y<1) are all different from each other. That is: X1=0.4; Y1=0.2; Y2=0.3; and X2=0.5.

The layers 2–8 are formed one by one on the substrate 1 by known processes such as Molecular Beam Epitaxy (MBE) or Metal Organic Chemical Vapor Deposition (MOCVD). Since all of $Al_xGa_{1-x}As$ ($Al_yGa_{1-y}As$), which are mixed crystals, have a substantially same lattice constant as GaAs (X or Y=0) and AlAs (X or Y=1), those mixed crystals can be properly formed on the n-GaAs substrate 1, not depending on the value of X (Y) or the thickness of the layers. If other materials are used in place of the $Al_xGa_{1-x}As$-based material, the thickness of the layers has to be chosen so that the lattice constants do not mismatch.

After the layers 2–8 are formed, the both sides of each layer are etched out to form a mesa-shape as shown in FIG. 1 by a known chemical etching process. An etching mask having a desired pattern formed by a known photolithography process is used in the chemical etching process. The etching is performed to reach to the surface of n-GaAs layer 2, leaving stripe shaped layers 3–8 on the layer 2. Then, the insulation layer 9 is formed to cover the top surface of the layer 2, the mesa slopes and the top surface of the layer 8. The insulation layer 9 is formed, for example, by plasma Chemical Vapor Deposition (CVD). The opening 9a on the top of the layer 8 is etched out with a width of 400 μm. Then, the electrode layer 10 composed of, e.g., three layers, Cr/Pt/Au is formed, for example, by Electron Beam Deposition. The electrode layer 10 is heat-treated (e.g., at about 360° C.) to form an ohmic contact with the layer 8. The other electrode layer 11 composed of three layers such as AuGe/Ni/Au is formed on the bottom surface of the substrate 1 and heat-treated to form an ohmic contact with the substrate 1, in the same manner as the electrode layer 10. Then, the junction metal layer 12 composed of two layers Au/Sn or an Au—Sn alloy layer is formed on the electrode layer 11 by a known process such as Electron Beam Deposition.

Finally, both longitudinal ends of the substrate 1, on which the layers described above are formed, are cut-out, making a laser chip having a size, for example, of 500 μm×800 μm. The stripe of the active layer 5 of the laser chip extends between both sides of the chip with an effective width of about 400 μm. Both cut-out end surfaces of the chip form a pair of reflective mirrors between which a resonant cavity is formed. The laser chip thus made is mounted on a base plate having a high heat conductivity such as a copper plate. Both electrode layers 10, 11 are electrically connected to a power source for driving the laser device.

Figures 2A, 2B:
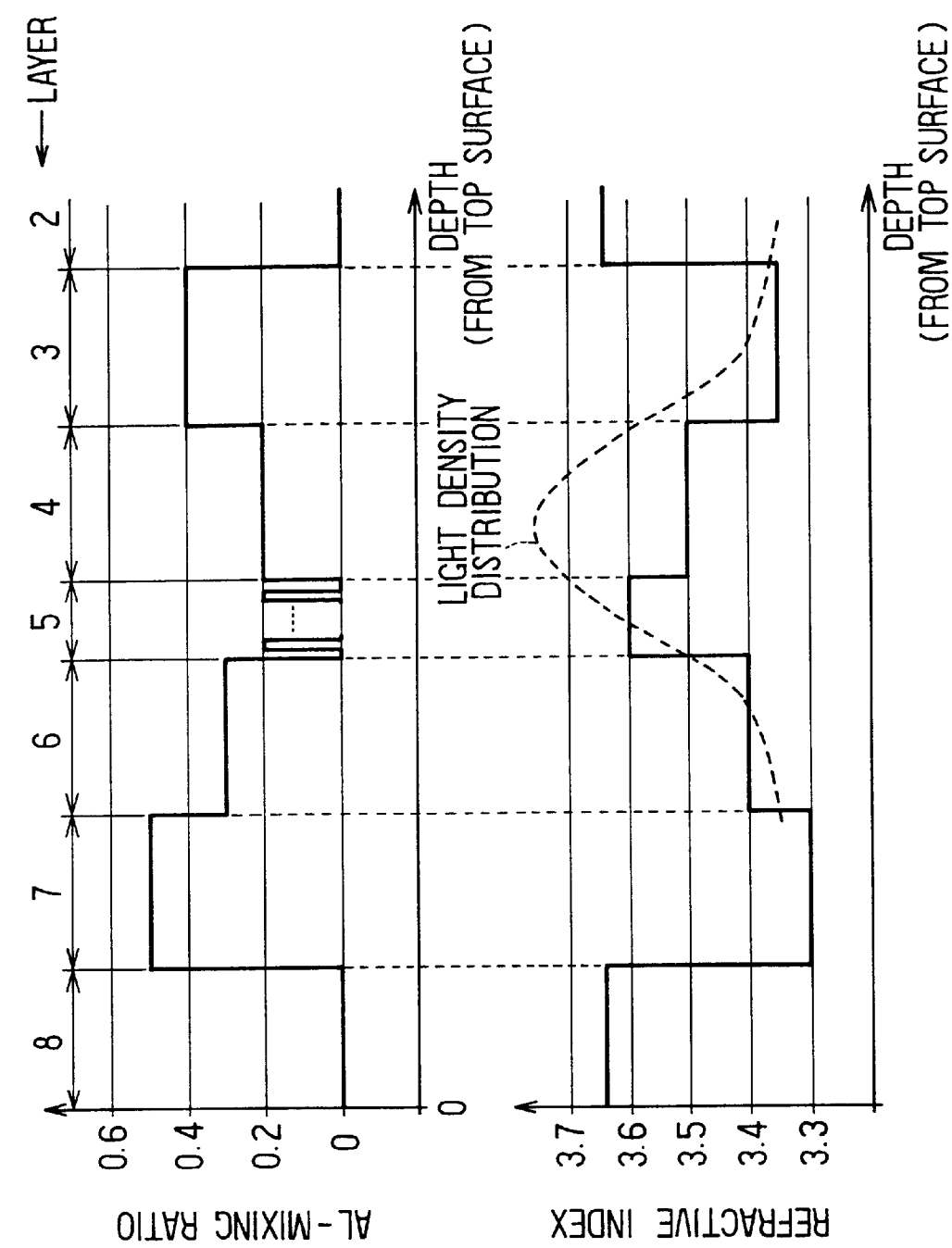
FIG. 2A is a graph showing an aluminum-mixing ratio in each layer of the first embodiment.
FIG. 2B is a graph showing a refractive index of each layer and a light density distribution in the first embodiment.
Figure 4:
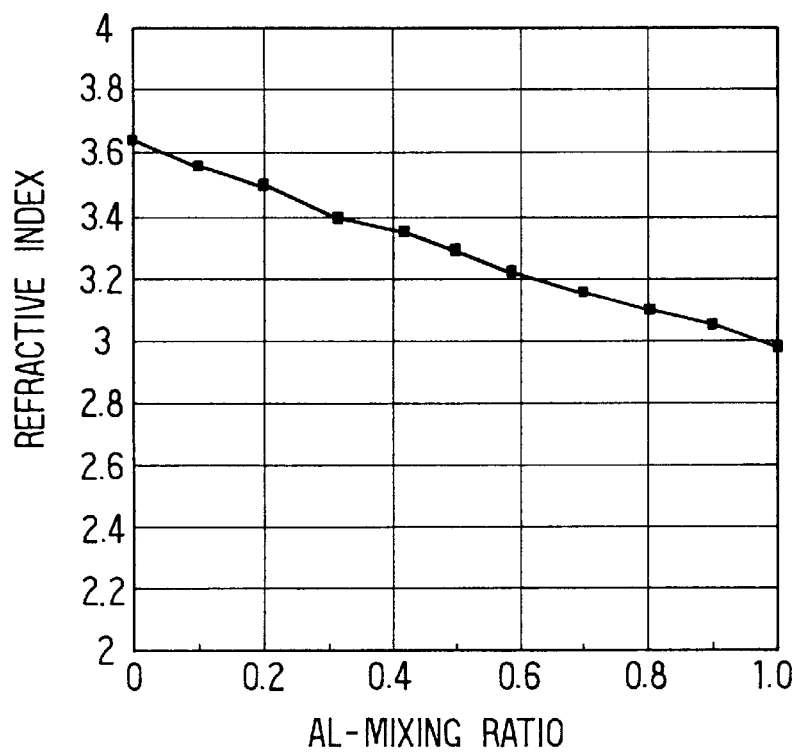
FIG. 4 is a graph showing a relation between an aluminum-mixing ratio in a layer and a refractive index.

Referring to FIGS. 2A and 2B, operation of the laser device as the first embodiment will be described. FIG. 2A shows the aluminum-mixing ratios in the respective layers, while FIG. 2B shows refractive indices corresponding to the aluminum-mixing ratios and a light density distribution in the layers. Among the aluminum-mixing ratios X1, Y1, Y2 and X2, there is a following relation:

$$0<Y1<Y2<X1<X2<1,$$

because Y1=0.2, Y2=0.3, X1=0.4 and X2=0.5 as described above. Generally, in an AlGaAs-based material, its band gap increases as the aluminum-mixing ratio becomes high, and its refractive index as an optical characteristic decreases. More particularly, the relation between the aluminum-mixing ratio and the refractive index is shown in FIG. 4. This graph is plotted for light having a wave-length of 850 nm. The refractive indices of the layers 3–8 having respective aluminum-mixing ratios as shown in FIG. 2A are those shown in FIG. 2B. That is, the refractive index $\alpha 1$ of the first clad layer 3 is 3.35, the refractive index $\beta 1$ of the first optical guide layer 4 is 3.5, the refractive index $\beta 2$ of the second optical guide layer 6 is 3.4, and the refractive index $\alpha 2$ of the second clad layer 7 is 3.3.

The refractive index of the active layer 5 shown in FIG. 2B is an average refractive index for plural layers in the multi-quantum-well. In calculating the average refractive index, the thickness of each layer in the multi-quantum-well is considered by giving a respective weight.

Generally, light is confined more in a region having a higher refractive index. In the laser device having a refractive index distribution shown in FIG. 2B, the light generated in the active layer 5 is confined in the device with a density distribution as shown by a dotted line. That is, a peak of the light density appears in the first optical guide layer 4 (not in the active layer 5), because the refractive index $\beta 1$ of the first optical guide layer 4 is higher than $\beta 2$ of the second optical guide layer 6, and the refractive index $\alpha 1$ of the first clad layer 3 is higher than $\alpha 2$ of the second clad layer 7. The light generated in the active layer 5 is effectively confined in those layers 3–7 with such a distribution. In other words, since the refractive index distribution in the laser device is asymmetric with respect to the active layer 5, the light density distribution is also asymmetric. This means that a peak of the driving current which appears in the active layer 5 does not overlap with the peak of light density. Therefore, energy concentration which otherwise occurs in the active layer 5 is avoided, and deterioration due to dislocation in the crystal caused by the energy concentration is greatly alleviated. Thus, the life time of the laser device is prolonged. In addition, carriers for driving the laser device are effectively confined in the active layer 5 because of its multi-quantum-well structure, and accordingly a threshold value of the driving current becomes small. As a whole, the efficiency of the laser device is enhanced.

Further, since the active layer 5 and both optical guide layers 4, 6 are formed with the AlGaAs-based material, the light having a wave-length of 780–900 nm (850 nm in this particular embodiment) is generated, which is particularly suitable for an infrared laser radar. A laser device having an active layer width of 100–400 μm can generate a laser output of several tens watts. Since the active layer 5 is formed with a 400 μm width in this particular embodiment, the laser device can be driven by pulse current of several tens amperes and generates an output of several tens watts.

The light density distribution in the layers is not limited to that shown in FIG. 2B. Important is shifting the light density peak from the active layer 5. To shift the peak, it is possible to variously choose the aluminum-mixing ratios. For example, they may be chosen in the following manner: X1=0.5, Y1=0.3, Y2=0.2 and X2=0.4, so that there exists a following relation among them.

$$0<Y2<Y1<X2<X1<1$$

By choosing those aluminum-mixing ratios, the graphs of FIGS. 2A and 2B are rotated by 180 degree with respect to the active layer 5, moving the light density peak from the first optical layer 4 to the second optical layer 6. The thickness of each layer may be variously selected so that the output light beam is emitted with a desired vertical angular range.

Figures 5A, 5B:
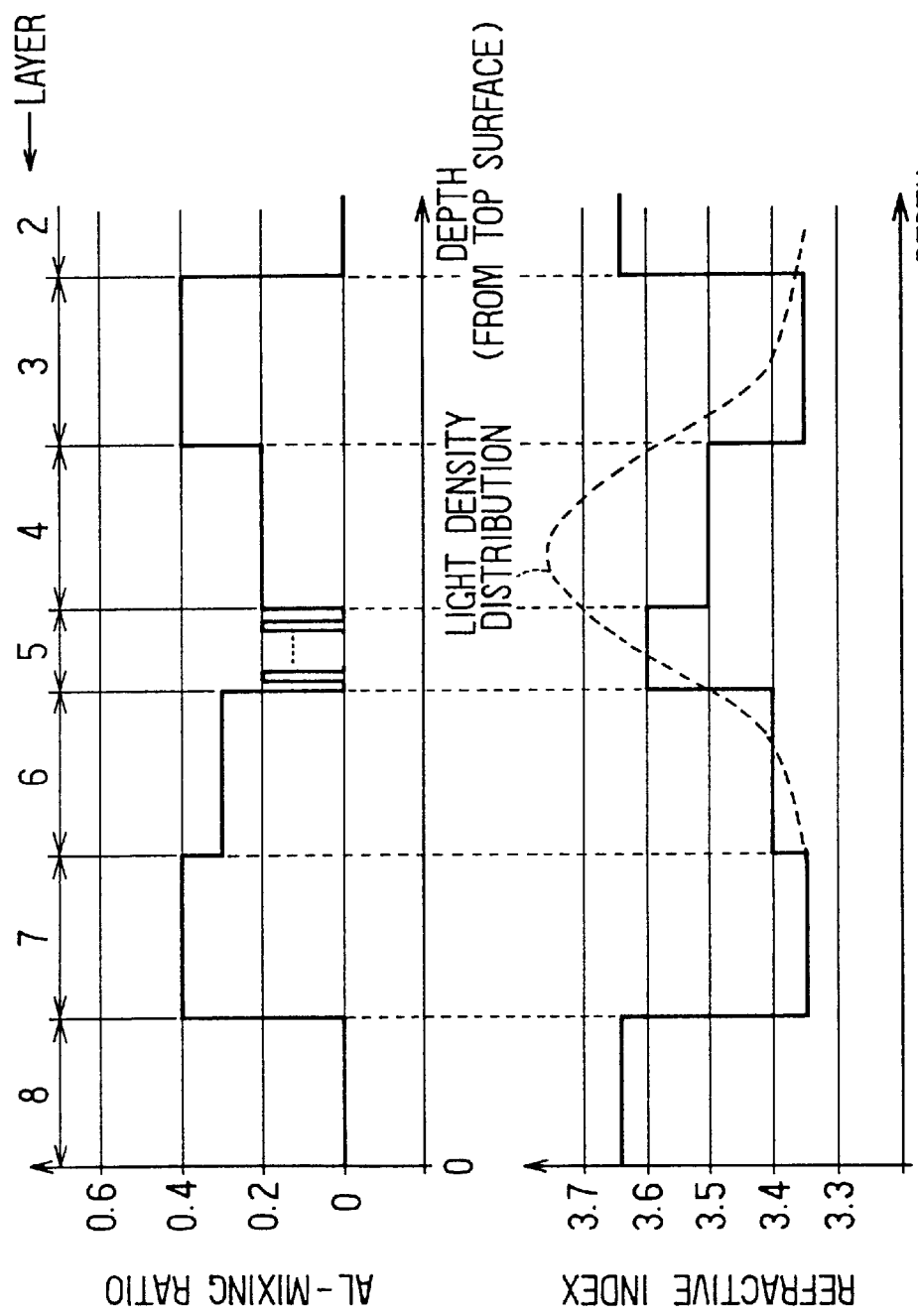
FIG. 5A is a graph showing an aluminum-mixing ratio in each layer of the laser device as a second embodiment.
FIG. 5B is a graph showing a refractive index of each layer and a light density distribution in the second embodiment.

A second embodiment of the present invention will be described in reference to FIGS. 5A and 5B. In this embodiment, the aluminum-mixing ratios of the layers 3, 4, 6 and 7 are selected as follows: X1=0.4, Y1=0.2, Y2=0.3 and X2=0.4. Corresponding refractive indices are: $\alpha 1$=3.35, $\beta 1$=3.5, $\beta 2$=3.4 and $\alpha 2$=3.35. Among the aluminum-mixing ratios in the layers 3, 4, 6 and 7, there is a following relation:

$$0<Y1<Y2<X1=X2<1$$

In this embodiment, too, a peak of the light density appears in the first optical guide layer 4 (not in the active layer 5), because the refractive index β1 of the first optical guide layer 4 is higher than the refractive index β2 of the second optical guide layer 6. The structure of the second embodiment is a little simpler than that of the first embodiment because X1 is made equal to X2, and Y1 and Y2 can be selected from a wider range.

The level of the aluminum-mixing ratios may be modified in various ways. For example, the levels of Y1 and Y2 may be exchanged, making Y1=0.3 and Y2=0.2 while keeping X1 and X2 at the same level of 0.4. The relation among the aluminum-mixing ratios become:

0<Y2<Y1<X1=X2<1

In this case, the peak of the light density appears in the second optical guide layer 6.

The aluminum-mixing ratios and corresponding refractive indices of a third embodiment are shown in FIGS. 6A and 6B, respectively. In the third embodiment, aluminum-mixing ratios are selected as: Y1=Y2=0.2, X1=0.3 and X2=0.4. The aluminum-mixing ratios in both optical guide layers 4, 6 are set at a same level of 0.2, and those in both clad layers 3, 7 are set at levels different from each other. The peak of the light density appears in the first optical guide layer 4 (not in the active layer 5), because the refractive index α1 of the first clad layer 3 is higher than the refractive index α2 of the second clad layer 7 though both refractive indices β1, β2 of both optical guide layers 4, 6 are the same. Since both levels of Y1 and Y2 are the same, the levels of X1 and X2 can be selected from a wider range. The levels of X1 and X2 may be exchanged in the same manner as described in the first and second embodiments.

Figures 7A, 7B:
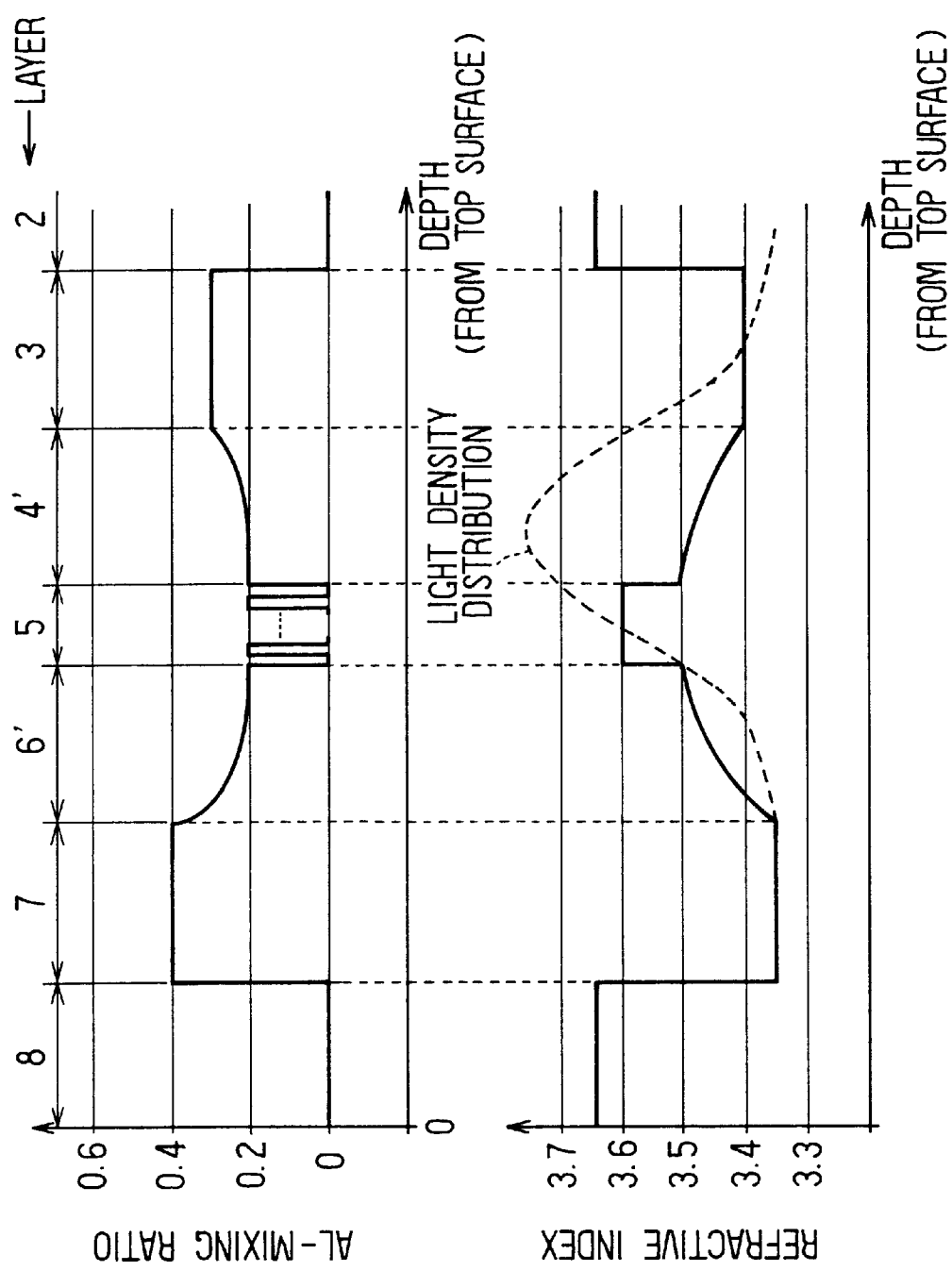
FIG. 7A is a graph showing an aluminum-mixing ratio in each layer of the laser device as a fourth embodiment.
FIG. 7B is a graph showing a refractive index of each layer and a light density distribution in the fourth embodiment.

FIGS. 7A and 7B show the aluminum-mixing ratios in the layers 2–8 and corresponding refractive indices of a fourth embodiment, respectively. The structure of the fourth embodiment is a so-called Graded-index Separate Confinement Heterostructure (GRIN-SCH) in which the aluminum-mixing ratio in the optical guide layers 4', 6' varies continuously from one level to another level. In this embodiment, the aluminum-mixing ratio X1 in the first clad layer 3 is set at 0.3, and X2 in the second clad layer 7 is set at 0.4. A first optical guide layer 4' and a second optical guide layer 6', in both of which the aluminum-mixing ratio varies gradually and continuously, are formed at both sides of the active layer 5. The aluminum-mixing ratio Y1 in the first optical guide layer 4' varies continuously from 0.2 to 0.3. The aluminum-mixing ratio Y2 in the second optical guide layer 6' varies continuously from 0.2 to 0.4. As shown in FIG. 7B, both refractive indices of the first and second optical guide layers 4', 6' continuously vary corresponding to the aluminum-mixing ratios. The peak of light density appears in the first optical guide layer 4' in this embodiment, too, because the refractive index α1 of the first clad layer 3 is higher than the refractive index α2 of the second clad layer 7. Thus, the energy concentration to the active layer 5 is avoided. The aluminum-mixing ratios in the first and second clad layers 3, 7 may be exchanged in the same manner as in other embodiments described above.

Figure 8:
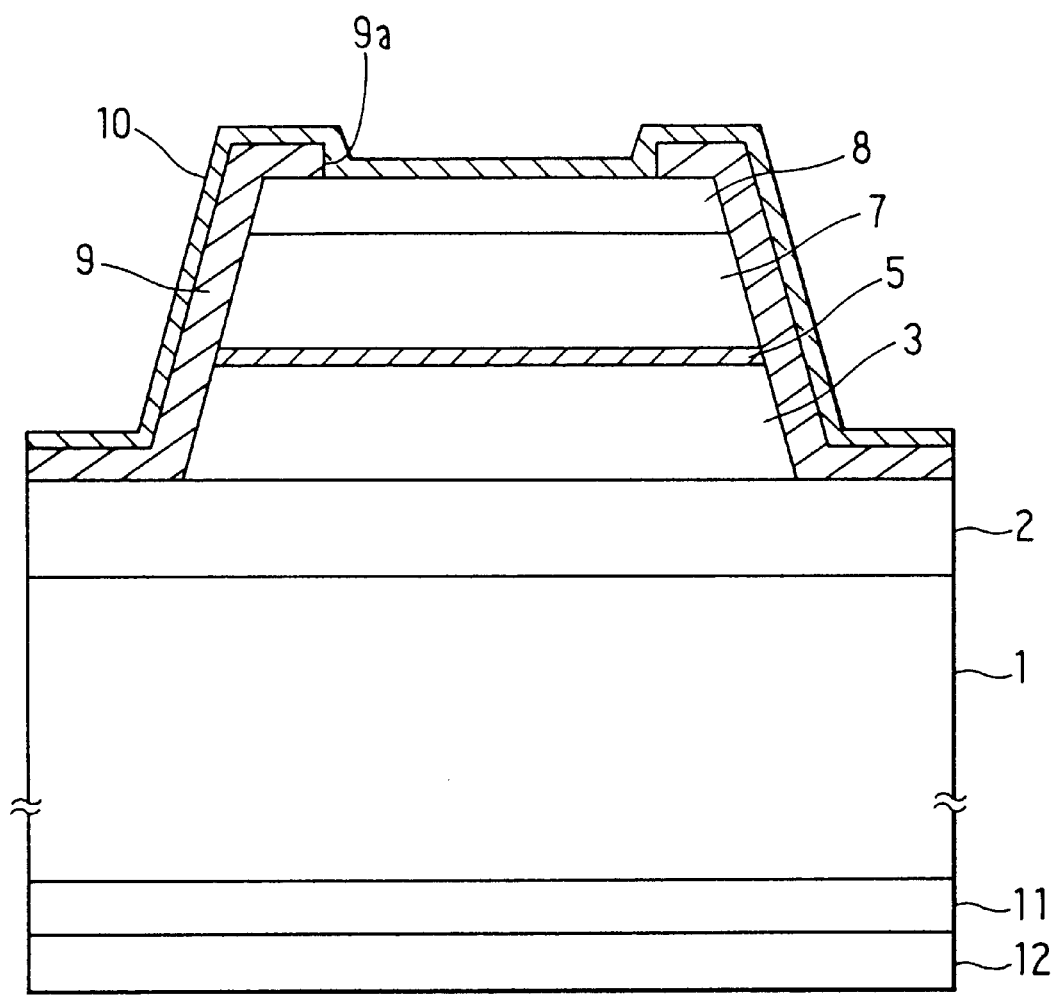
FIG. 8 is a schematic cross-sectional view showing a structure of a semiconductor laser device as a fifth embodiment.
Figures 9A, 9B:
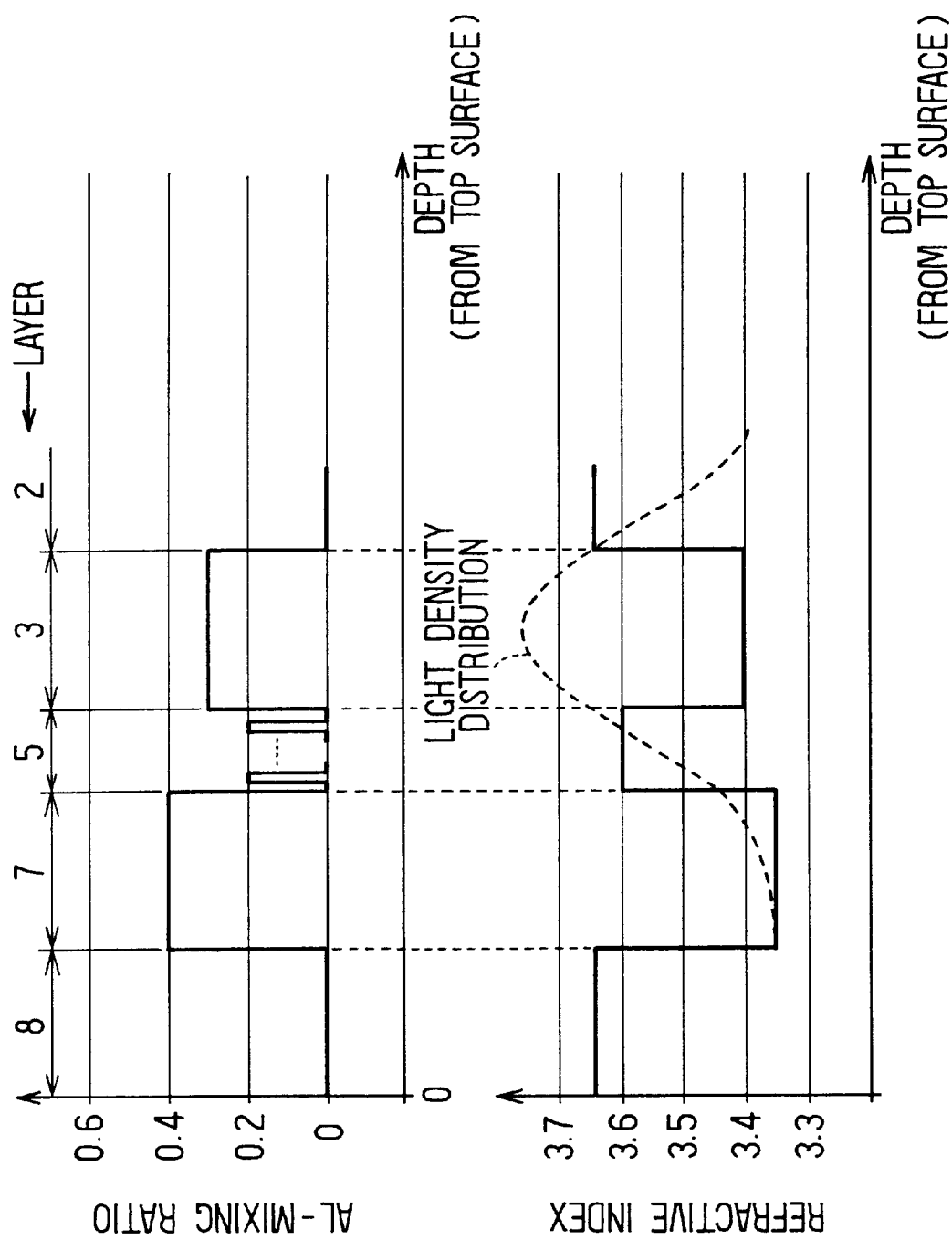
FIG. 9A is a graph showing an aluminum-mixing ratio in each layer of the laser device as the fifth embodiment.
FIG. 9B is a graph showing a refractive index of each layer and a light density distribution in the fifth embodiment.
Figures 12A, 12B:
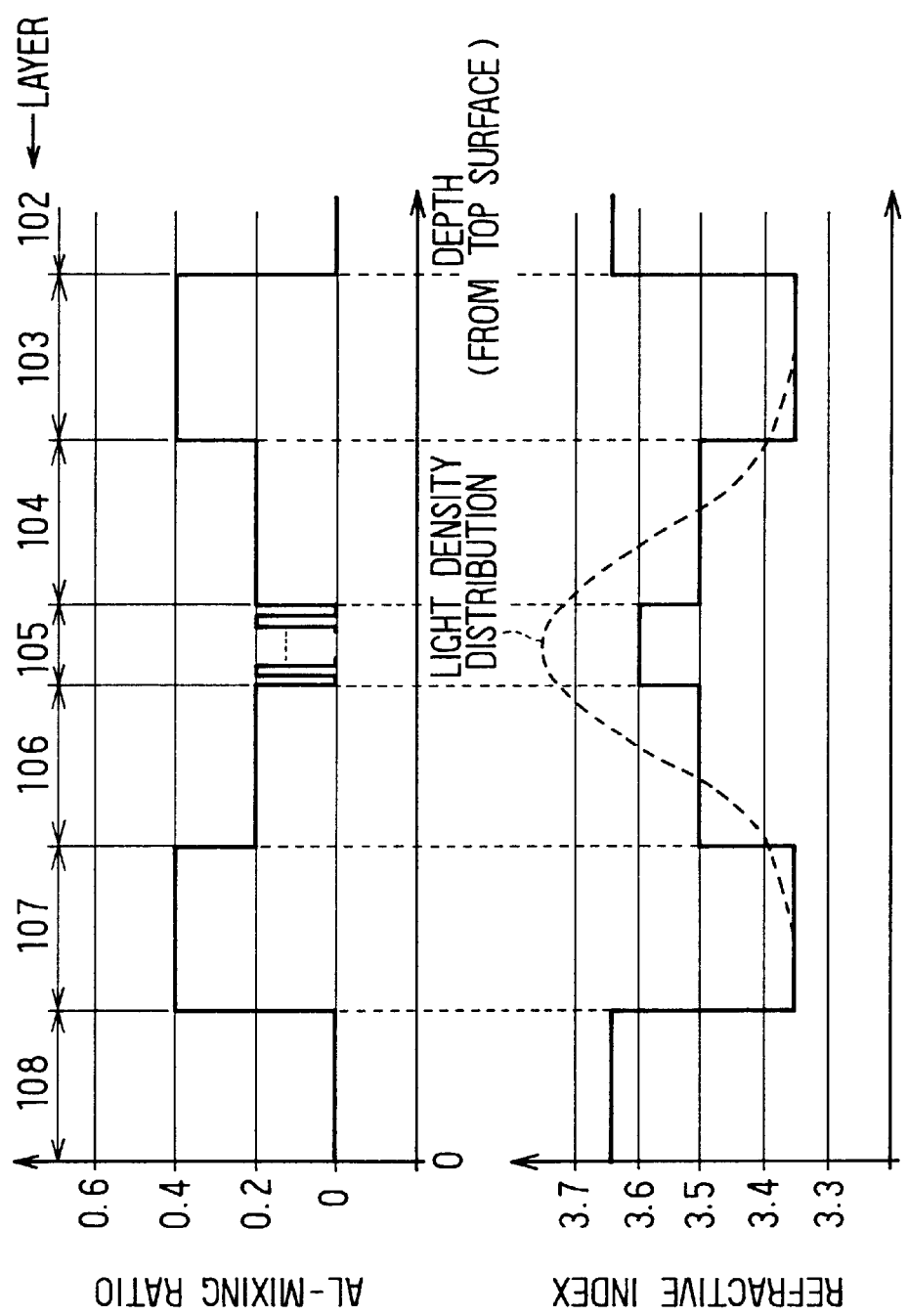
FIG. 12A is a graph showing an aluminum-mixing ratio in each layer of a conventional laser device.
FIG. 12B is a graph showing a refractive index of each layer and a light density distribution in the conventional laser device.

A structure of a fifth embodiment is shown in FIG. 8, in which the first and second optical guide layers 4, 5 used in the first embodiment are eliminated. Other structures are the same as those of the first embodiment. In the fifth embodiment, X1 is 0.3 and X2 is 0.4 as shown in FIG. 9A, and corresponding refractive indices are shown in FIG. 9B. The peak of the light density appears in the first clad layer 3 because α1 of the first clad layer 3 is higher than α2 of the second clad layer 7 though there are no optical guide layers are provided. The levels of X1 and X2 may be exchanged, thus shifting the peak of light density from the first clad layer 3 to the second clad layer 7. The structure of the fifth embodiment is simpler than other embodiments, yet the energy concentration to the active layer 5 can be avoided.

A sixth embodiment of the present invention will be described in reference to FIGS. 10A and 10B. The sixth embodiment is similar to the first embodiment, except that the thickness of both optical guide layers 4, 6 is made different from each other as shown in FIG. 10A. That is, the thickness L1 of the first optical layer 4 is 1.5 μm and the thickness L2 of the second optical layer 6 is 1.0 μm. The aluminum-mixing ratios in the layers 3, 4, 6 and 7 are the same as those of the first embodiment. That is, X1=0.4, Y1=0.2, Y2=0.3 and X2=0.5. Therefore, the relation among them is the same as that of the first embodiment. That is:

0<Y1<Y2<X1<X2<1

Corresponding refractive indices of those layers are shown in FIG. 10B. The peak of the light density is shifted from the active layer 5 to the first optical guide layer 4 more than in the first embodiment, because the thickness L1 of the first optical guide layer 4 having a higher refractive index is thicker than the thickness L2 of the second optical guide layer 6. In other words, an effect of the thickness difference is added to the effect of the refractive index difference. Thus, the energy concentration to the active layer 5 is surely avoided.

The levels of the aluminum-mixing ratios in the layers 3, 4, 6 and 7 may be changed so that the left and right of the graphs in FIGS. 10A and 10B are reversed with respect to the active layer 5. The thickness L1 and L2 are also interchanged. That is, the aluminum-mixing ratios may be set as: X1=0.5, Y1=0.3, Y2=0.2 and X2=0.4 so that a following relation exists among them:

0<Y2<Y1<X2<X1<1

At the same time, thickness of both optical guide layers 4, 6 is set as: L1=1.0 μm<L2=1.5 μm. In this case, the peak of the light density appears in the second optical guide layer 6, with the same degree of shift from the active layer 5 as in the sixth embodiment.

The aluminum-mixing ratios and corresponding refractive indices of a seventh embodiment are shown in FIGS. 11A and 11B, respectively. In the seventh embodiment, the aluminum-mixing ratios in both optical guide layers 4', 6' vary continuously, and the thickness L13, L14 of both optical guide layers 40, 6' is made unequal. More particularly, the aluminum-mixing ratios and the thickness are selected as: X1=0.3, Y1=0.2–0.3 (varies continuously), Y2=0.2–0.4 (varies continuously), X2=0.4, L13=1.5 μm, and L14=1.0 μm. As a result, the refractive indices are distributed as shown in FIG. 11B, and the light density is distributed as shown with a dotted line in FIG. 11B. The peak of the light density is widely shifted from the active layer 5 to the first optical guide layer 4' due to combined effects of the thickness difference and the aluminum-mixing ratio difference, thereby avoiding energy concentration to the active layer 5.

In the same manner as in other embodiments, the light density peak may be shifted from the first optical guide layer 4' to the second optical guide layer 6'. For this purpose, the aluminum-mixing ratios and the thickness may be selected as follows: X1=0.4, Y1=0.2–0.4, Y2=0.2–0.3, X2=0.3, L13=1.0 μm, and L14=1.5 μm.

The embodiments described above may be modified in various ways. For example, the number of layers in the multi-quantum-well constituting the active layer 5 may be changed according to required characteristics and output. Also, the thickness and the aluminum-mixing ratio of each layer in the multi-quantum-well may be modified.

The thickness of the optical guide layer and the clad layer may be properly modified to meet requirements as to a vertically spreading angle of the laser beam. The aluminum-mixing ratios in those layers may be modified or changed as long as a relative relation therebetween are satisfactory to attain the object to avoid energy concentration to the active layer.

The refractive index of each layer may be controlled not only by changing the aluminum-mixing ratio in the AlGaAs-based material but also by using different materials. The material of the substrate 1 is not limited to a GaAs-based material, but other compound semiconductor materials or semiconductor materials such as Si may be used as the substrate.

Though the embodiments described above are designed as a high power laser device to be pulse-driven, the present invention is applicable also to other laser devices such as those driven by a continuous power or those used in communication systems.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor laser device comprising:

a semiconductor substrate;

a plurality of semiconductor layers including a first clad layer, a first optical guide layer, an active layer, a second optical guide layer and a second layer, the plurality of semiconductor layers being laminated on the substrate in this order; and an insulation layer located on one surface of at least one of the layers, wherein a refractive index of one of the layers located on a first surface of the active layer is different from a refractive index of one of the layers located on a second surface of the active layer to avoid light energy concentration in the active layer.

2. The semiconductor laser device as in claim 1, wherein:

the refractive index of the first optical guide layer is different from that of the second optical guide layer, while the refractive index of the first clad layer is the same as that of the second clad layer.

3. The semiconductor laser device as in claim 1, wherein:

the refractive index of the first clad layer is different from that of the second clad layer, while the refractive index of the first optical guide layer is the same as that of the second optical guide layer.

4. The semiconductor laser device as in claim 1, wherein:

the first clad layer is made of $Al_{X1}Ga_{1-X1}As$, and the second clad layer is made of $Al_{X2}Ga_{1-X2}As$, where $X1 \neq X2$.

5. The semiconductor laser device as in claim 4, wherein:

either one of the first or the second clad layer having a smaller aluminum-mixing ratio is thicker than the other.

6. The semiconductor laser device as in claim 1, wherein:

the first clad layer is made of $Al_{X1}Ga_{1-X1}As$, and the second clad layer is made of $Al_{X2}Ga_{1-X2}As$;

the first and second optical guide layers are made of $Al_Y Ga_{1-Y}As$; and $X1 \neq X2$, and both X1 and X2 are larger than Y.

7. The semiconductor laser device as in claim 1, wherein:

the first clad layer and the second clad layers are made of $Al_X Ga_{1-X}As$;

the first optical guide layer is made of $Al_{Y1}Ga_{1-Y1}As$, and second optical guide layer is made of $Al_{Y2}Ga_{1-Y2}As$;

$Y1 \neq Y2$, and both Y1 and Y2 are smaller than X; and either of the first optical guide layer or the second optical guide layer having a lower aluminum-mixing ratio is thicker than the other.

8. The semiconductor laser device as in claim 1, wherein:

the first and second clad layers and the first and second optical guide layers are all made of AlGaAs-base material; and aluminum-mixing ratios in the first and second optical guide layers are different from each other.

9. A semiconductor laser device comprising:

a semiconductor substrate; and a plurality of semiconductor layers including a first clad layer, a first optical guide layer, an active layer, a second optical guide layer and a second clad layer, the plurality of semiconductor layers being laminated on the substrate in this order, wherein a refrative index of the first optical guide layer is higher than a refractive index of the second optical guide layer.

10. The semiconductor laser device as in claim 9, wherein:

the refractive index of the first optical guide layer varies continuously between the refractive indices of the active layer and the first clad layer; and the refractive index of the second optical guide layer varies continuously between the refractive indices of the active layer and the second clad layer.

11. The semiconductor laser device as in claim 9, wherein:
the first optical guide layer is thicker than the second optical guide layer.

12. The semiconductor laser device as in claim 10, wherein:

either one of the optical guide layers contacting a clad layer having a higher refractive index is thicker than the other.

13. The semiconductor laser device as in claim 10, wherein:

either one of the optical guide layers contacting a clad layer having a lower aluminum-mixing ratio is thicker than the other.

14. A semiconductor laser device comprising:

a semiconductor substrate;

a lower semiconductor layer formed on the substrate, the lower semiconductor layer having a first refractive index;

an active layer formed on the lower semiconductor layer; and an upper semiconductor layer formed on the active layer, the upper semiconductor layer having a second refractive index, wherein the semiconductor layer that has the higher refractive index is thicker than the other semiconductor layer.

15. The semiconductor laser device as in claim 14, wherein:
light generated in the active layer is distributed among the layers so that a density peak of the light appears in either the upper or lower semiconductor layer having the higher refractive index.

16. A semiconductor laser device comprising:
a semiconductor substrate;
a first clad layer formed on the substrate and made of $Al_{X1}Ga_{1-X1}As$;
a first optical guide layer formed on the first clad layer and made of $Al_{Y1}Ga_{1-Y1}As$;
an active layer formed on the first optical guide layer;
a second optical guide layer formed on the active layer and made of $Al_{Y2}Ga_{1-Y2}As$; and
a second clad layer formed on the second optical guide layer and made of $Al_{X2}Ga_{1-X2}As$;
an insulation layer on one surface of at least one of the layers,
wherein one of the following relations exists among aluminum-mixing ratios, X1, Y2, Y1 and Y2: Y1<Y2<X1<X2, and Y2<Y1<X2<X1.

17. The semiconductor laser device as in claim 16, wherein:
either one of the first or the second optical guide layer having a lower aluminum-mixing ratio is thicker than the other.

18. The semiconductor laser device as in claim 16, wherein:
both X1 and X2 are equal to or larger than 0.4; and
both Y1 and Y2 are one of equal to or larger than 0.1, and equal to or smaller than 0.3.

19. The semiconductor laser device as in claim 16, wherein:
the thickness of the first and second optical guide layers is equal to or thicker than 0.5 $\mu$m.

20. The semiconductor laser device as in claim 16, wherein:
light generated in the active layer is distributed among the layer so that a density peak of the light appears in either the first or second optical guide layer having a lower aluminum-mixing ratio.

21. The semiconductor laser device as in claim 16, wherein: a difference between X1 and X2 is equal to or larger than 0.1.

22. The semiconductor laser device as in claim 16, wherein: a difference between Y1 and Y2 is equal to or larger than 0.1.

23. The semiconductor laser device as in claim 17, wherein: the difference in thickness between the first optical guide layer and the second optical guide layer is equal to or larger than 0.5 $\mu$m.

24. A semiconductor laser device comprising:
a semiconductor substrate;
a first clad layer formed on the substrate and made of $Al_{X1}Ga_{1-X1}As$;
a first optical guide layer formed on the first clad layer and made of $Al_{Y1}Ga_{1-Y1}As$;
an active layer formed on the first optical guide layer;
a second optical guide layer formed on the active layer and made of $Al_{Y2}Ga_{1-Y2}As$;
a second clad layer formed on the second optical guide layer and made of $Al_{X2}Ga_{1-X2}As$; and
an insulation layer located on one surface of at least one of the layers,
wherein the aluminum-mixing ratio YI continuously varies between the aluminum-mixing ratio in the active layer and the aluminum-mixing ratio X1 in the first clad layer,
wherein the aluminum-mixing ratio Y2 continuously varies between the aluminum-mixing ratio in the active layer and the aluminum-mixing ratio X2 in the second clad layer, and
wherein X1≠X2.

25. The semiconductor laser device as in claim 24, wherein:
thickness of the first and second optical guide layers is equal to or thicker than 0.5 $\mu$m.

26. The semiconductor laser device as in claim 24, wherein:
either one of the optical guide layers contacting a clad layer having a lower aluminum-mixing ratio is thicker than the other.

27. The semiconductor laser device as in claim 24, wherein:
either one of the optical guide layers having a higher refractive index is thicker than the other.

28. A semiconductor laser device comprising:
a semiconductor substrate;
a lower semiconductor layer formed on the substrate;
an active layer formed on the lower semiconductor layer;
an upper semiconductor layer formed on the active layer; and
an insulation layer located on one surface of at least one of the layers,
wherein one of the lower semiconductor layer and the upper semiconductor layer has a higher refractive index than the other semiconductor layer, and
wherein a density peak of a light generated in the active layer appears in the one of the lower semiconductor layer and the upper semiconductor layer.

29. A semiconductor laser device comprising:
a semiconductor substrate;
a lower semiconductor layer formed on the substrate;
an active layer formed on the lower semiconductor layer;
an upper semiconductor layer formed on the active layer; and
an insulation film formed to cover at least one side of the active layer,
wherein one of the lower semiconductor layer and the upper semiconductor layer has a higher refractive index than the other, and
wherein the semiconductor layer that has the higher refractive index is thicker than the other semiconductor layer.

30. The semiconductor laser device as in claim 29, wherein:
light generated in the active layer is distributed among the layers so that a density peak of the light appears in either the upper or lower semiconductor layer having the higher refractive index.

31. A semiconductor laser device comprising:
a semiconductor substrate;
a lower semiconductor layer formed on the substrate;
an active layer formed on the lower semiconductor layer;
an upper semiconductor layer formed on the active layer;

an insulation film formed to cover sides of the layers; and end surfaces defining a longitudinal dimension of the laser device and a resonant cavity of laser light generated in the active layer, wherein:

the active layer uniformly extends between the sides covered by the insulation film and between the end surfaces, a refractive index of the active layer being uniform in an area thereof, one of the lower semiconductor layer and the upper semiconductor layer has a higher refractive index than the other, and the semiconductor layer that has the higher refractive index is thicker than the other semiconductor layer.

32. The semiconductor laser device as in claim 31, wherein:

light generated in the active layer is distributed among the layers so that a density peak of the light appears in either the upper or lower semiconductor layer having the higher refractive index.

33. A semiconductor laser device comprising:

a semiconductor substrate; and a plurality of semiconductor layers including a first clad layer, a first optical guide layer, an active layer, a second optical guide layer and a second clad layer, the plurality of semiconductor layers being laminated on the substrate in this order, wherein:

a refractive index of one of the layers located on a first surface of the active layer is different from a refractive index of one of the layers located on a second surface of the active layer, the layer having a higher refractive index being thicker than the layer having a lower refractive index.

34. The semiconductor laser device as in claim 1, 9, 14, 16, 24, 28, 29, 31 or 33 wherein:

the active layer has a multi-quantum-well structure which is formed by laminating alternately first layers made of a semiconductor material having a first energy band gap and second layers made of a semiconductor material having a second energy band gap, the first and second energy band gaps being different from each other.

35. The semiconductor laser device as in claim 1, 9, 14, 16, 24, 28, 29, 31 or 33, wherein:

the active layer is rectangular-shaped, and a width thereof is equal to or wider than 100 $\mu$m.

36. The semiconductor laser device as in claim 1, 9, 14, 16, 24, 28, 29, 34, or 33, further comprising, a pulse current driver to drive the laser with laser device with tens of amperes to generate a light output of tens of watts.

* * * * *